(12) United States Patent
Paul et al.

(10) Patent No.: US 9,329,226 B2
(45) Date of Patent: May 3, 2016

(54) METHOD FOR ASCERTAINING AT LEAST ONE MALFUNCTION OF A CONDUCTIVE CONDUCTIVITY SENSOR

(71) Applicant: Endress + Hauser Conducta Gesellschaft für Mess- und Regeltechnik mbH + Co. KG, Gerlingen (DE)

(72) Inventors: Stefan Paul, Dobeln (DE); Stephan Buschnakowski, Chemnitz (DE); Robert Tzschoppe, Dobeln (DE)

(73) Assignee: ENDRESS + HAUSER CONDUCTA GESELLSCHAFT FUR MESS- UND REGELTECHNIK MBH + CO. KG, Gerlingen (DE)

( * ) Notice: Subject to any disclaimer, the term of this patent is extended or adjusted under 35 U.S.C. 154(b) by 130 days.

(21) Appl. No.: 13/940,622

(22) Filed: Jul. 12, 2013

(65) Prior Publication Data

US 2014/0015540 A1    Jan. 16, 2014

(30) Foreign Application Priority Data

Jul. 16, 2012   (DE) .................. 10 2012 106 384

(51) Int. Cl.
*G01R 31/28* (2006.01)
(52) U.S. Cl.
CPC .................. *G01R 31/2829* (2013.01)
(58) Field of Classification Search
CPC ..... G01N 27/06; G01N 33/007; G01N 27/07; G01N 27/4162–27/4165; G01N 27/4175; G01D 3/08; G01D 18/00; G01D 18/008; G01R 31/2829

USPC ......... 324/512, 514, 515, 519, 522–527, 537, 324/439–450, 633, 658–690, 691–722; 204/401

See application file for complete search history.

(56) References Cited

U.S. PATENT DOCUMENTS 3,661,748 A * 5/1972 Blackmer ............... 204/401
4,822,456 A * 4/1989 Bryan ..................... 205/789
(Continued)

FOREIGN PATENT DOCUMENTS

CN    102269805 A    12/2011
CN    102422151 A    4/2012
(Continued)

OTHER PUBLICATIONS

German Search Report, German PTO, Munich, Mar. 5, 2013.

*Primary Examiner* — Arleen M Vazquez
*Assistant Examiner* — Lee Rodak
(74) *Attorney, Agent, or Firm* — Bacon & Thomas, PLLC

(57) ABSTRACT

A method and a sensor for ascertaining at least one malfunction of a conductive conductivity sensor having at least two electrodes applying a first electrical variable to the electrodes measuring at least a second electrical variable on the electrodes and deciding whether a malfunction is present based on measuring the second electrical variable. The second electrical variable is located in a first range when measuring the medium when no malfunction is present, and the second electrical variable is located in a second range in the case of a first malfunction, especially when the conductivity sensor is located at least partially outside of the medium, and the second electrical variable is located in a third range when a second malfunction is present, especially an electrode break or a break in a line to the electrodes.

4 Claims, 4 Drawing Sheets a)

b)

(56) References Cited

U.S. PATENT DOCUMENTS

| | | | |
|---|---|---|---|
| 5,189,375 A * | 2/1993 | Tuttle | 324/537 |
| 5,455,513 A | 10/1995 | Brown | |
| 5,469,070 A * | 11/1995 | Koluvek | 324/713 |
| 5,977,773 A * | 11/1999 | Medelius et al. | 324/520 |
| 6,369,579 B1 | 4/2002 | Riegel | |
| 7,429,865 B2 * | 9/2008 | Dreibholz et al. | 324/692 |
| 2008/0204037 A1 * | 8/2008 | Fukami | 324/537 |

FOREIGN PATENT DOCUMENTS

| | | |
|---|---|---|
| DE | 19844489 A1 | 3/2000 |
| DE | 69425160 T2 | 3/2001 |
| WO | 2011042106 A1 | 4/2011 |

* cited by examiner a) b)

a)

b)

a)

b)

c)

d)

e)

US 9,329,226 B2

METHOD FOR ASCERTAINING AT LEAST ONE MALFUNCTION OF A CONDUCTIVE CONDUCTIVITY SENSOR

TECHNICAL FIELD

The invention relates to a method for ascertaining at least one malfunction of a conductive conductivity sensor having at least two electrodes.

BACKGROUND DISCUSSION

Conductive conductivity sensors are applied in varied applications for measuring conductivity of a medium.

The most well-known conductive conductivity sensors are the two electrode sensors and the four electrode sensors.

Two electrode sensors have two electrodes immersed in the medium in measurement operation and supplied with an alternating voltage. A measuring electronics connected to the two electrodes measures an electrical impedance of the conductivity measurement cell, from which then, based on an earlier determined cell constant, which depends on the geometry and other properties of the measuring cell, a specific resistance, or a specific conductance, of the medium located in the measuring cell is ascertained.

Four electrode sensors have four electrodes immersed in the medium in measurement operation, of which two are operated as so called electrical current electrodes and two as so called voltage electrodes. Applied between the two electrical current electrodes in measurement operation is an alternating voltage, which leads to an alternating electrical current flowing through the medium. The electrical current effects a potential difference between the voltage electrodes, which is determined by a preferably currentless measurement. Also in this case, by means of a measuring electronics connected to the electrical current- and voltage electrodes, the impedance of the conductivity measurement cell resulting from the supplied alternating electrical current and the measured potential difference is determined, from which then, based on an earlier determined cell constant, which depends on the geometry and other properties of the measuring cell, a specific resistance, or a specific conductance, of the medium located in the measuring cell is determined.

In conductivity sensors of today, it is not possible to detect an electrode break. This means that the user cannot always be sufficiently sure concerning the functional ability of the sensor. It is furthermore not possible to distinguish whether the sensor is located in air or whether the line to the electrodes from an evaluating electronics is interrupted.

SUMMARY OF THE INVENTION

An object of the invention, therefore, is to detect a change of state of the electrodes of a conductive conductivity sensor.

The object is achieved by a method, comprising the steps as follows:
 applying a first electrical variable to the electrodes,
 measuring at least a second electrical variable on the electrodes, and
 deciding whether a malfunction is present based on measuring the second electrical variable,
a) wherein the second electrical variable is located in a first range when measuring the medium when no malfunction is present,
b) wherein the second electrical variable is located in a second range in the case of a first malfunction, especially when the conductivity sensor is located at least partially outside of the medium, and
c) wherein the second electrical variable is located in a third range when a second malfunction is present, especially a second malfunction in the form of an electrode break or a break in a line to the electrodes.

By dividing the measuring range of the second electrical variable into three ranges, it is possible to detect the state of the electrodes of the sensor.

In a preferred embodiment, used as a second electrical variable is the electrical current flowing through the electrodes. In this way, a relatively simple evaluating circuit can be used.

In an advantageous form of embodiment, the second range has a smaller value than the first range, and the third range has a smaller value than the second range. This stepping of the ranges makes the above described analysis a) "sensor measurement OK", b) "sensor outside of the medium" and c) "sensor electrodes not capable of functioning" possible.

In an advantageous further development, used as second electrical variable is the magnitude of the impedance between the electrodes. This measured variable is implementable with relatively few components.

In an advantageous further development, used as the second electrical variable is the magnitude of the impedance between the electrodes. This measured variable is implementable with relatively few components.

In an additional advantageous further development, used as the second electrical variable is the capacitance between the electrodes. This measured variable is a most direct sign of an undesired state of the electrodes.

In an additional advantageous further development, the electrodes form with an electrical circuit an oscillatory circuit, and frequency is used as the second electrical variable. In this way, extremely small deviations can be detected.

In an additional advantageous further development, the first electrical variable is provided in the form of a pulse, especially a rectangular pulse, and used as the second electrical variable is the decay behavior of the pulse.

In an additional advantageous further development, an integrated circuit, especially a microcontroller, is provided, and used as the second electrical variable is a method executable by the integrated circuit. An integrated circuit can execute all of the methods described above for detecting a change of state of at least one electrode.

Besides the named options, the inherent options of a microcontroller can be used, for instance, for implementing an oscillator with an integrated comparator and the electrode, and evaluating the behavior of the oscillator. Another option is that the integrated clock source of the microcontroller is used to count the charge/discharge cycles of the electrode capacitor, in order to detect a deviation as a state change.

Preferably used as the first electrical variable is an electrical alternating variable. Such a variable, which is especially simple to implement, is an alternating voltage.

The object is furthermore achieved by a conductivity sensor for performing the method.

In an advantageous embodiment, the conductivity sensor includes at least four electrodes, which are combined pairwise to form a first electrode pair and a second electrode pair, wherein a circuit for switching the first electrical variable between the first electrode pair and the second electrode pair is provided. Thus, electrical current- and voltage electrodes can be examined separately from one another for their states.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
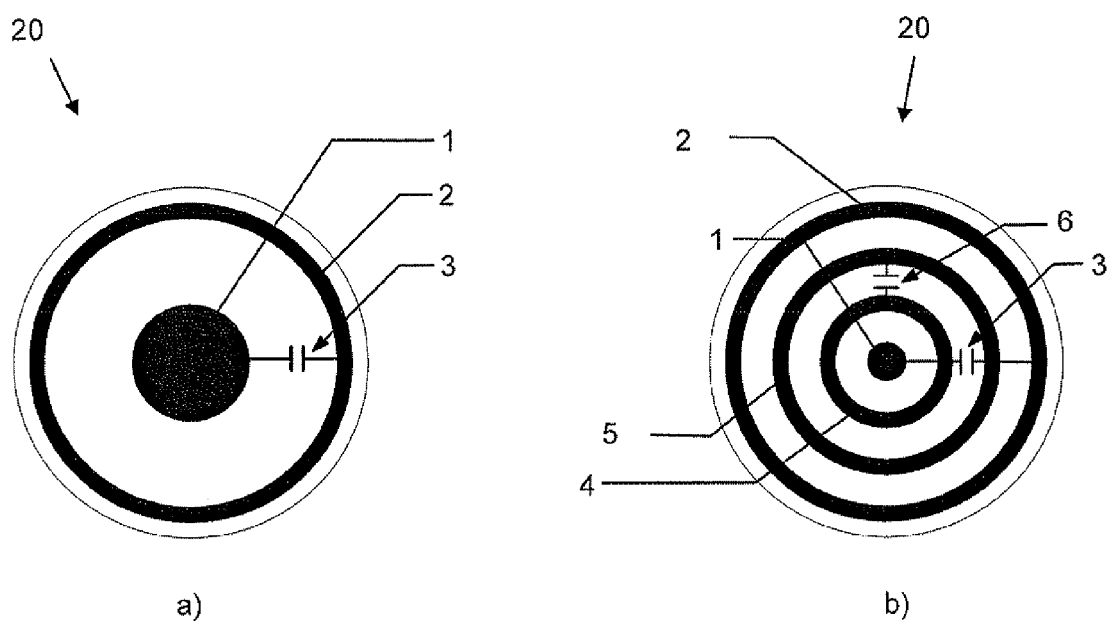
FIG. 1 is an equivalent circuit diagram of a sensor having two, respectively four, electrodes.

In the figures, equal features are provided with equal reference characters.

FIG. 1 shows a conductivity sensor 20 with an arrangement of the electrodes in a configuration with two electrodes (FIG. 1a)) and four electrodes (FIG. 1b)). In such case, the electrical current electrodes are provided with the reference characters 1 and 2 and the voltage electrodes with the reference characters 4 and 5.

Formed between the electrodes in the illustrated equivalent circuit diagram is a capacitance 3, respectively 6.

Figure 2:
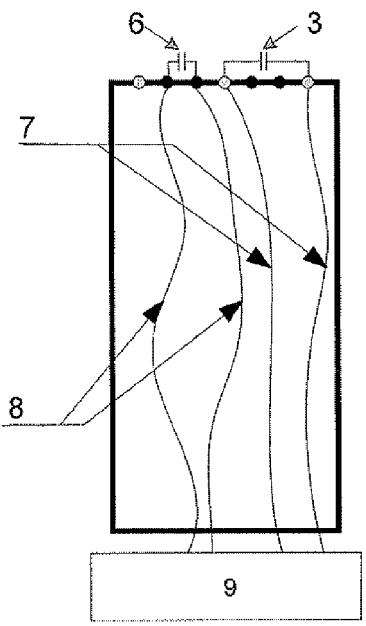
FIG. 2 is a schematic representation of the capacitances of the electrodes with and without break.
Figure 2:
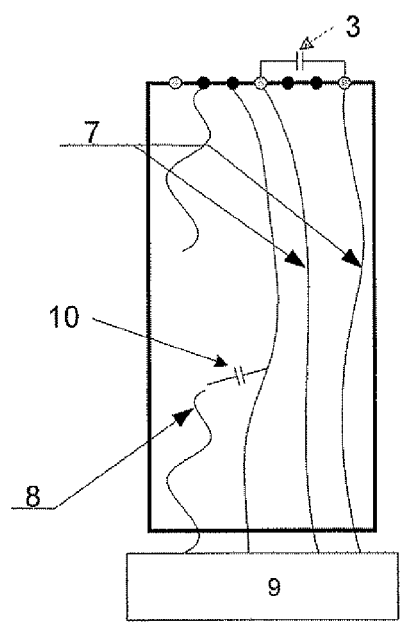

FIG. 2 shows the electrodes schematically with their lead lines 7 and 8 to an evaluating electronics 9. The evaluating electronics 9 can be embodied, for instance, as a measurement transmitter. In FIG. 2a) the lead lines are OK and the measuring system functions as desired.

FIG. 2b) shows the measuring system with a broken lead line 8. There forms between the one broken end and the electrode a parasitic capacitance 10.

With the help of the method of the invention, state changes are recognized as follows. First, a first electrical variable, especially an electrical alternating variable, for example, an alternating voltage, is applied to the electrodes 1 and 2 (and, in given cases, 4 and 5). This can be done from the evaluating electronics 9, i.e. a measurement transmitter. Other sources are also suitable, however.

In a next step, a second electrical variable is measured. This can be, for example, the electrical current, which flows through the electrodes. Other options include, however, also the magnitude of the impedance or capacitance. Typically, however, the electrical current is measured, since then circuit complexity is least.

If everything is OK, i.e. the electrodes are intact and all electrodes 1, 2 (and, in given cases, also 4, 5) are located in the medium to be measured (compare FIG. 2a)), then a comparatively large electrical current is measured. The electrical current is conducted by charge carriers in the medium.

If the conductivity sensor is located at least partially outside of the medium, i.e. in the air, the electrical current no longer flows completely through the medium. An electrical current characteristic for the geometry of the electrodes, similar to a plate capacitor, is measured. This electrical current is smaller than the electrical current in the case of measuring in the medium.

If an electrode or a lead line is broken (compare FIG. 2b)), then a yet smaller electrical current is measured. This electrical current is, thus, smaller than the electrical current in the case of intact electrodes in air.

By measuring the electrical current, it can, thus, be detected, in which state the electrodes are located and whether, as well as which, malfunction is present.

By way of example and without limitation, here the example of "pure water" will be used. Pure water has an electrolytic conductivity of, for instance, 1 μS/cm. In the case of a cell constant (which essentially depends on the geometry of the electrodes) of 0.01 cm$^{-1}$, there results, thus, a measurable resistance of 10 kΩ. In the case of equal sensor, i.e. constant cell constant, the following holds: The higher the resistance of the medium to be measured, the greater is the capacitance of the electrodes, respectively, the influence of capacitance.

Figure 3:
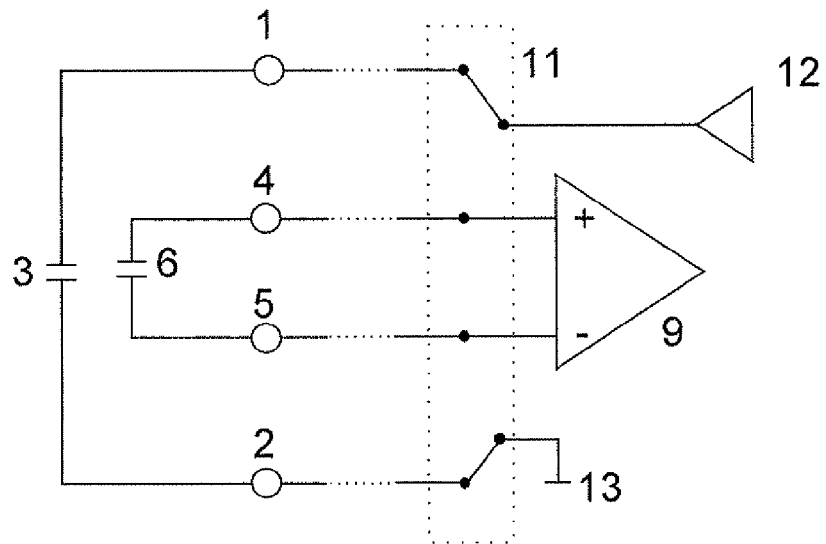
FIG. 3 is a schematic representation of circuits options for switching between first electrode pair and second electrode pair.
Figure 3:
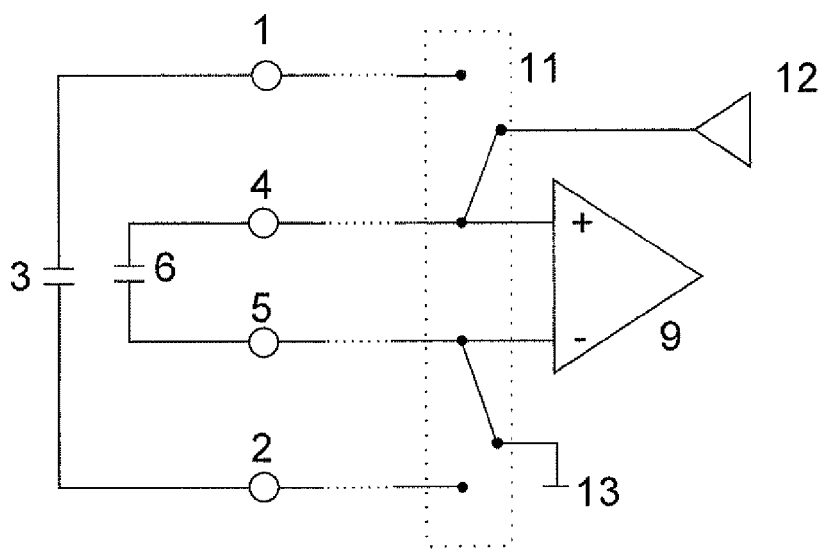
Figure 3:
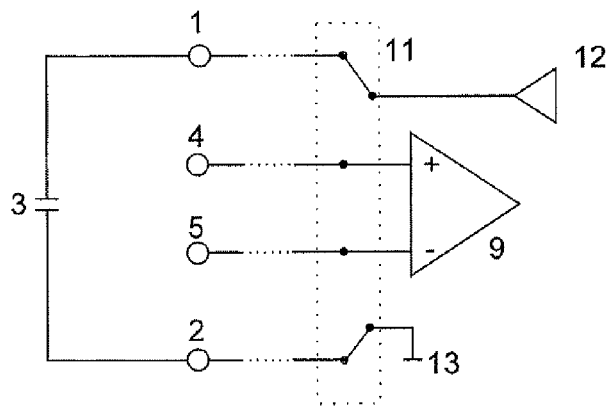
Figure 3:
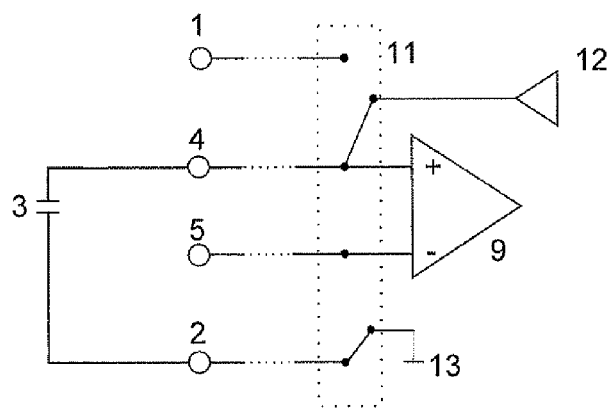
Figure 3:
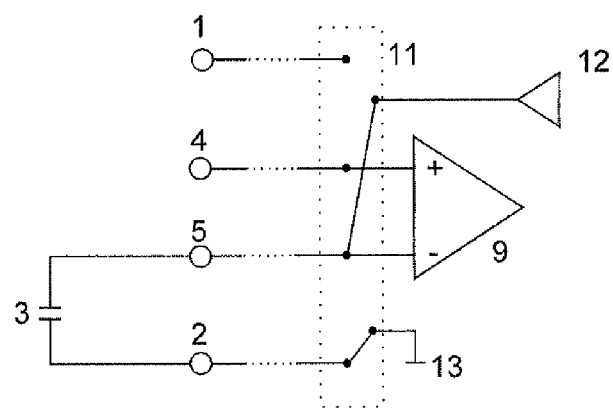

In the case of a conductivity sensor with four electrodes, a circuit for switching the first electrical variable is necessary. FIG. 3 shows schematically an example of such a circuit. In FIG. 3a), the switch 11 is directed to the electrical current electrodes 1, 2, and in FIG. 3b) to the voltage electrodes 4, 5. An electrical current source 12, for example, also integrated in the measurement transmitter, i.e. the evaluating electronics 9, serves for feeding in of the electrical current. The electrical current path is, in each case, connected with ground 13. Figures FIG. 3c), FIG. 3d) and FIG. 3e) show circuits, in the case of which the electrodes 1, 2, or 4, 5 are not read-out pairwise as electrical current-, or voltage electrodes. Instead, a voltage electrode can be connected with an electrical current electrode. The read-out can occur sequentially. Also, a multiplexer can be integrated into the evaluating electronics 9.

As alternative for electrical current measurement, the electrodes can form together with optional inductive components (for instance, also implemented in the evaluating electronics 9) an oscillatory circuit. If a malfunction is present, i.e. a lead line is broken, an electrode is broken or at least one electrode is located at least partially outside of the medium, the frequency of the oscillatory circuit changes. This can be detected, for instance, by the evaluating electronics 9.

Furthermore, an option is that a pulse in the form of a rectangular signal is applied to the electrodes. The decay behavior of the pulse is characteristic for the state of the electrodes and shows whether a malfunction is present.

In an embodiment, an integrated circuit, especially a microcontroller, can be connected to the electrodes 1, 2, respectively 4, 5.

With an integrated circuit, an option is to perform all above described methods for detecting a change of state of at least one electrode.

Moreover, also other evaluation options are implementable: An integrated circuit, especially a microcontroller, has, as a rule, a number of inputs, at least one integrated amplifier, comparator, clock source, etc. These inherent means provide options, for example, to detect a change of the first electrical variable. Thus, for instance, the electrodes 1, 2, respectively 3, 4, can be connected with the integrated comparator of the microcontroller, in order so to produce an oscillator. A change of the state of the electrodes 1, 2, respectively 3, 4, is detected in the form of a frequency change. Alternatively, the electrodes 1, 2, respectively 3, 4, can be connected with the clock source of the microcontroller. Thus, for instance, the charge- and discharge times can be measured. A change of the state of the electrodes 1, 2, respectively 3, 4 is detected as a change in the charge- and discharge times.

The invention claimed is:

1. A method for ascertaining at least one malfunction of a conductive conductivity sensor having at least two electrodes, wherein the conductivity sensor is applied for measuring conductivity of a medium, comprising the steps of:
   applying a first electrical variable to the electrodes;
   measuring at least a second electrical variable on the electrodes; and
   deciding whether a malfunction is present based on measuring the second electrical variable, wherein:
   the second electrical variable is located in a first range when measuring the medium when no malfunction is present;

the second electrical variable is located in a second range in the case of a first malfunction, when the conductivity sensor is located at least partially outside of the medium; and the second electrical variable is located in a third range when a second malfunction is present, a second malfunction in the form of an electrode break or a break in a line to the electrodes;

wherein the capacitance between the electrodes is used as the second electrical variable.

2. The method as claimed in claim 1, wherein:

an electrical alternating variable is used as the first electrical variable.

3. A conductivity sensor for performing a method, when the conductivity sensor is applied for measuring conductivity of a medium, of ascertaining at least one malfunction of the conductivity sensor, the conductivity sensor comprising:

at least two electrodes;

an electrical circuit;

wherein the electrical circuit is configured to apply a first electrical variable to the electrodes, to measure at least a second electrical variable on the electrodes, and to decide whether a malfunction is present based on measuring the second electrical variable;

wherein the second electrical variable is located in a first range when measuring the medium when no malfunction is present, the second electrical variable is located in second range in the case of a first malfunction when the conductivity sensor is located at least partially outside of the medium, and the second electrical variable is located in a third range when a second malfunction in the form of an electrode break or a break in a line to the electrodes is present; and wherein the capacitance between the electrodes is used as the second electrical variable.

4. The conductivity sensor for performing a method as claimed in claim 3, wherein:

the conductivity sensor includes at least four electrodes, which are combined pairwise to form a first electrode pair and a second electrode pair; and a circuit for switching the first electrical variable between first electrode pair and second electrode pair is provided.

\* \* \* \* \*